US007428979B2

United States Patent

(12) United States Patent
Glever et al.

(10) Patent No.: US 7,428,979 B2
(45) Date of Patent: Sep. 30, 2008

(54) PROCESS FOR SOLDERING AN ELECTRONIC COMPONENT ON AN ELECTRONIC CARD, PROCESS FOR REPAIRING THE CARD AND INSTALLATION FOR USING THE PROCESS

(75) Inventors: Bernard Glever, Nangis (FR); Erick Henry, Ozouer (FR); José Chenot, Chaville (FR)

(73) Assignee: Hispano Suiza, Colombes (FR)

( * ) Notice: Subject to any disclaimer, the term of this patent is extended or adjusted under 35 U.S.C. 154(b) by 581 days.

(21) Appl. No.: 11/012,284

(22) Filed: Dec. 16, 2004

(65) Prior Publication Data

US 2005/0133574 A1 Jun. 23, 2005

(30) Foreign Application Priority Data

Dec. 19, 2003 (FR) .................................. 03 15110

(51) Int. Cl.
*B23K 1/012* (2006.01)
*B23K 1/008* (2006.01)

(52) U.S. Cl. ....................... 228/232; 228/119; 228/120; 228/122.1; 228/123.1; 228/124.5; 228/219; 228/223; 228/224

(58) Field of Classification Search .............. 228/111.5, 228/207, 19, 191, 264, 232, 224, 223, 219, 228/124.5, 123.1, 122.1, 120, 119; 432/121
See application file for complete search history.

(56) References Cited

U.S. PATENT DOCUMENTS 5,560,531 A * 10/1996 Ruszowski ................... 228/19
5,735,450 A * 4/1998 Heim et al. ................. 228/191
5,769,989 A 6/1998 Hoffmeyer et al.
6,736,907 B2 * 5/2004 Taguchi et al. ................ 148/23
7,026,664 B2 * 4/2006 Divakar et al. .............. 257/107

FOREIGN PATENT DOCUMENTS

| | | | |
|---|---|---|---|
| EP | 0 097 796 | A2 | 1/1984 |
| EP | 0 871 352 | A1 | 10/1998 |
| EP | 1 275 462 | A1 | 1/2003 |
| JP | 11-121912 | | 4/1999 |

OTHER PUBLICATIONS

Patent Abstracts of Japan, JP 04 179294, Jun. 25, 1992.
Bret A. Zahn, "Inverted PCB Heat Slug/Sink for Microelectronic Packages", Motorola Inc., Schaumburg, Illinois, US, vol. 33, Dec. 1, 1997, pp. 30-31, XP000753413.

* cited by examiner

*Primary Examiner*—Jerry Lorengo
*Assistant Examiner*—Erin P Barry
(74) *Attorney, Agent, or Firm*—Oblon, Spivak, McClelland, Maier & Neustadt, P.C.

(57) ABSTRACT

A process for soldering an electronic component onto a support which includes at least one heat drain for the component. The method uses a solder paste which incorporates a stripping flux activated at a first temperature, and a solder alloy melted at a second temperature. The process includes preheating the support on the face opposite the component through the heat drain up to the first temperature, placing the component on the support with the solder paste, heating the component by applying a hot gas at a sufficiently high temperature to bring the solder alloy to the melting temperature.

11 Claims, 2 Drawing Sheets

110 22 10 120 121 121 122 1 102 20 100 102 104 106

PROCESS FOR SOLDERING AN ELECTRONIC COMPONENT ON AN ELECTRONIC CARD, PROCESS FOR REPAIRING THE CARD AND INSTALLATION FOR USING THE PROCESS

This invention relates to electronic cards and in particular to means of assembling their components by soldering.

An electronic card globally comprises a plane support in the form of a card made of an electrically insulating material. Electronic components are mounted on this support and comprise means of making an electrical connection to conducting elements integrated on the card, by soldering. The support is commonly referred to as a PCB (Printed Circuit Board) in this field.

Conventional components, of the type with peripheral outputs, in other words for which connection pins are arranged around the periphery of the package containing the electronic chip, may easily be soldered to the substrate. Heat necessary to melt the solder can be added and soldering can be done by bringing the heat source close to the peripheral pins without the risk of causing damage to the component due to excess heat.

Technological progress now enables the use of increasingly compact components, with so-called surface outputs. FIG. 1 shows a diagram of a component 10 of the type referred to in this field as BGA (Ball Grid Array). The component includes an electronic chip 11 embedded in an encapsulation material 12 and a substrate 13 below it. Transfer balls 15 are fixed to the substrate on the other side and are deposited on a grid. Some of the balls 15A are electrically connected to the chip 11 by appropriate electrical connection means 16A. Some balls 15B located in the central part of the substrate are electrically and thermally connected to the chip by connection means 16B to remove heat from it.

Compared with components with peripheral outputs, the use of components with surface outputs has the disadvantage that they need to be heated for soldering since the balls cannot be accessed in any other way. Thus, such components have to be heated to the soldering temperature that is 215° C., in order to solder or unsolder them. It must be guaranteed that the temperature remains below the maximum temperature that the chip can resist, that is 250° C.

Furthermore, in some applications such as aeronautical applications, electronic cards are embedded in packages in which no cooling air can circulate. The so-called PWB support is then equipped with metal heat drains through which heat is dissipated towards the skin of the package inside which the electronic card is located. FIG. 2 shows the mounting of a component with surface outputs 10 onto a PWB type support 20. The assembly is contained in a metallic package 30. The support 20 comprises metal drains 22 for example made of copper, that are in contact with the thermal areas 15B of the component 10, through thermal connection means 23. The drains are also in thermal contact with the package 30. Heat is thus evacuated through the wall of the package by heat conduction. Furthermore, a weather varnish 40 covers the entire card, particularly for aeronautical applications, and protects it from humidity.

It is important to be able to replace defective components in order to repair the electronic cards, due to their high cost in some applications, particularly aeronautical applications. The replacement must be done without disturbing adjacent components. One difficult step is to locally provide a sufficient quantity of heat to melt the solder only on the component to be replaced.

The presence of heat drains and weather varnish in this context is a disadvantage when the objective is to remove such a component from its support and to solder another component.

FIG. 3 shows an installation according to prior art used for disassembly of a component with surface outputs 10 from its support 20. Hot air is blown above it towards the component by means of a nozzle 50. The nozzle is equipped with a suction pipette for removal of the component after the solder has been melted. Heating may possibly be done by a laser beam. A maximum amount of energy is added from underneath the support, either by blowing hot air at a temperature of the order of 300° C., or by infrared heating. Installations according to prior art are not satisfactory because heating means cannot prevent melting of solder on adjacent components and on components located under the component to be replaced.

Moreover, solutions according to prior art are certainly not suitable for soldering a new component or unsoldering an existing component when the support includes heat drains. In this case, it is essential to provide a greater quantity of heat to take account of the fact that it is dissipated through the drain. This excess heat causes damage to adjacent components. Furthermore, the weather varnish can also melt, due to the heating temperature. It can migrate to nearby solder and deteriorate the electrical connections.

The invention is intended to solve the problems mentioned above.

According to the invention, the process for soldering an electronic component onto a support comprising at least one heat drain for the said component using solder paste incorporating a stripping flux activated at a first temperature, and a solder alloy melting at a second temperature greater than the first is characterised by the fact that it comprises steps consisting of:

- preheating the support through the heat drain up to the said first temperature,
- placing the component on the support with the solder paste,
- heating the component by applying a hot gas at a sufficiently high temperature to activate the flux and to bring the solder alloy up to the second temperature.

A solder paste used in the process according to the invention usually consists of a solder alloy generally in the form of balls, a very slight activation flux for surface treatment, and a thinner or a solvent.

Due to the invention, and particularly by heating through the heat drain of the support, the heat added during preheating is limited to the heat necessary to activate the flux, the support temperature and the temperature of the adjacent components remaining below the remelting temperature of the solder alloy used for these adjacent components. Furthermore, the heat necessary for the solder alloy to reach the melting temperature is added locally by the hot gas nozzle above the component.

According to another characteristic, preheating is done by heat conduction using a hot plate put into contact with the heat drain.

This heating process is particularly advantageous because it provides a means of controlling the heat flow. In particular, the hot plate is placed under the support on the side opposite the component.

According to another characteristic, heating of the component by hot air includes a preheating step to increase the component temperature to an intermediate temperature below the second temperature.

According to another characteristic, the card is placed in a chamber at least during the preheating step, to homogenise temperatures on the card.

According to another characteristic, hot gas is applied using a nozzle arranged perpendicular to the plane of the card, associated with a means forming a gas return duct after blowing onto the component.

The invention also relates to a process for repairing an electronic card incorporating a component soldered onto the support and that needs to be replaced. According to this process, the support is heated through the heat drain up to the said first temperature, the component to be replaced is heated by applying a hot gas at a sufficiently high temperature to bring the solder alloy of the said component to the second temperature, and the component is then removed.

This repair process has the advantage that it enables removal of the component without creating any thermal stress on the card, that could damage part of the card. More particularly, the added heat necessary to melt the solder alloy of the component to be removed can be localised without damaging connections of adjacent components or components underneath the support.

The invention also relates to an installation for the assembly and repair of electronic cards for use of the above mentioned process(es), comprising a means for attachment of the said card, a means for heating by heat conduction on one side of the card, and a means for heating by hot gas on the other side of the said card.

With this type of installation the above soldering process can be implemented and one component to be replaced can be unsoldered without affecting adjacent components.

According to another characteristic, the means of heating by conduction consists of a hot plate on which the card is placed. In particular, the installation includes heat conducting supports to be placed between the card and the hot plate.

According to another characteristic, the installation comprises a cover forming a temperature balancing chamber for the card. In particular, the cover comprises at least one opening to enable access to one of the said components using a heating means using hot gas passing through a nozzle. More precisely, the edges of the said opening are fitted with a wall perpendicular to the card so as to form a gas return duct between the card and the walls of the hot gas heating nozzle.

The invention will now be described in more detail with reference to the appended figures wherein.

Figure 4:
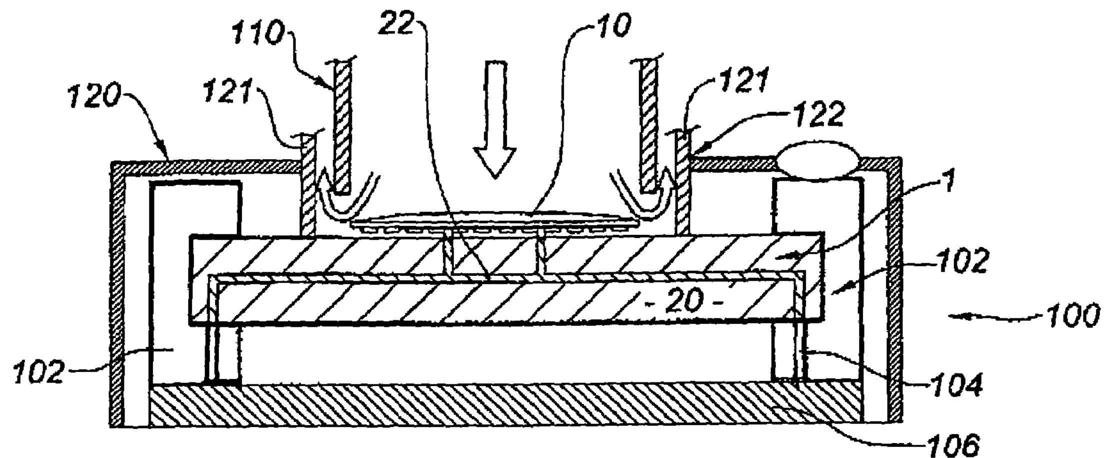

FIG. 4 shows an installation 100 for assembly and repair of electronic cards that can be used to solder or unsolder electronic components on a support, in which an electronic card 1 is placed with its support 20 on which the component 10 is arranged. The support 20 is shown with its heat drain 22. The support is in contact through pads 102 provided with heat drains 104 with a hot plate 106. The pads thus form heat-conducting supports. The means of heating the plate is not shown. For example, it might be electrical. A nozzle 110 is shown on the top of the card perpendicular to the support plane. The nozzle 110 is sufficiently wide to cover the component 10. The Figure shows two wall elements 121 outside the walls of the nozzle and parallel to its axis, forming a passage. They form a gas return duct. The arrows show the direction of the incident gas guided by the walls of the nozzle and of the same gas after its impact with the component.

Advantageously, the card and hot plate assembly is enclosed in a thermal protection chamber 120 in order to achieve good temperature uniformity in the various elements that make it up. Advantageously, the cover comprises openings 122 formed at locations at which the components to be soldered or unsoldered are located, depending on whether the card is to be assembled or repaired by replacing a component. These openings are blocked off, for example, at locations at which no action is necessary. The wall elements 121 may for example be located along the edges of the opening 122 so as to form a barrier to gases when a heating nozzle is placed through the opening. The walls form a duct with the walls of a nozzle that is placed in the opening.

Figure 5:
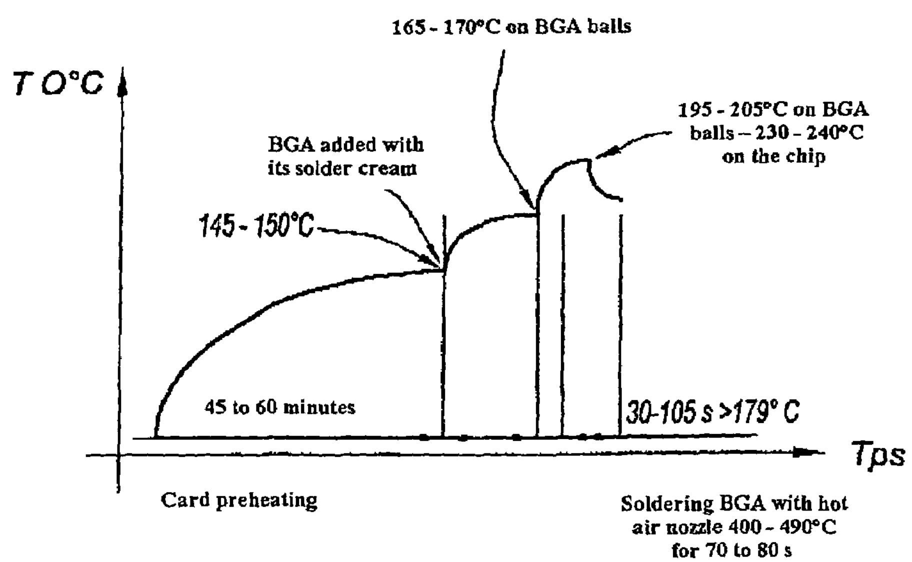
FIG. 5 shows a graph illustrating a soldering cycle.

A soldering cycle of a specific component is described with reference to the graph in FIG. 5.

The card is preheated for a time that varies from 45 to 60 minutes, using the hot plate; the heat produced by the plate is transmitted through conductors 104 to metallic elements forming the heat drains of the card. The temperature increases continuously until the card reaches a temperature of 145° C. to 150° C.

The component is then placed on the support, including solder paste between the component and the support. The temperature is high enough to activate the stripping flux contained in the solder cream.

Hot air is blown onto the component through the nozzle at a temperature of 250° C. to 300° C. for 3 to 4 minutes. Air is blown over the top surface of the component going around the free edge of the nozzle and is guided by the walls of the duct, being deviated at 180° from the initial direction. Thus, the temperature at the balls of the component gradually rises to 165° C.-170° C.

The temperature of the hot air is then increased up to 400-490° C.; the temperature of the balls progressively rises to 195-205° C. and the temperature of the chip: rises to 230-240° C. The melting temperature of the alloy from which the solder is made is reached, and the hot air flow is then cut off.

When making a repair to an electronic card, a similar cycle is advantageously performed, or preferably the same cycle as that used for soldering the component concerned, so as to simplify operating procedures. In particular, the card is preheated to the first temperature so that stresses created in the card are balanced.

Figure 1:
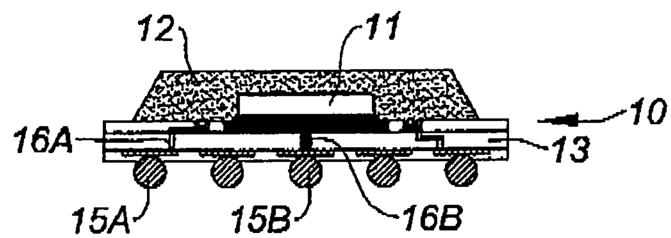
FIG. 1 shows a cross-sectional diagram of a component with surface outputs.
Figure 2:
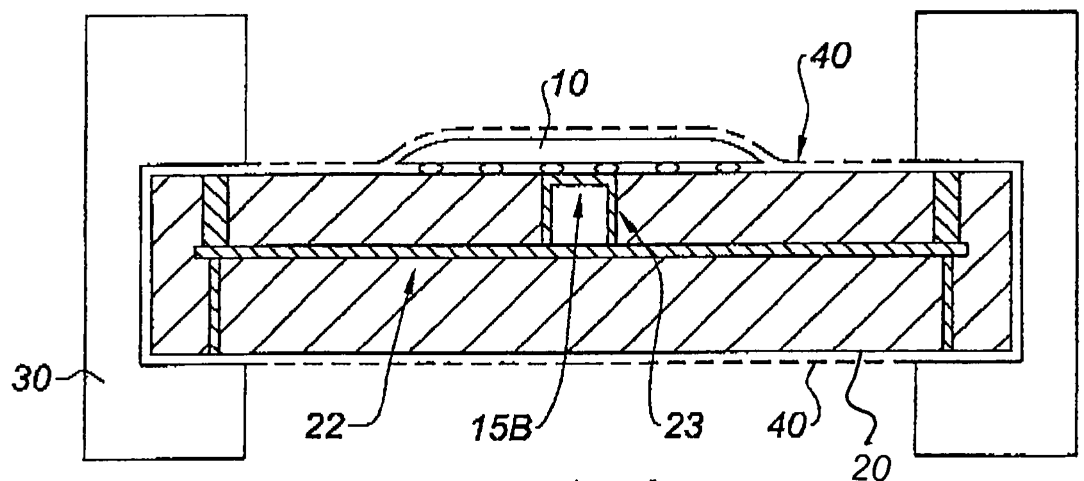
FIG. 2 shows a cross-sectional diagram of an electronic card with heat drains in the support, FIG. 3 diagrammatically shows an installation for soldering a component onto its support according to prior art, FIG. 4 diagrammatically shows an installation for implementing the process according to the invention.
Figure 3:
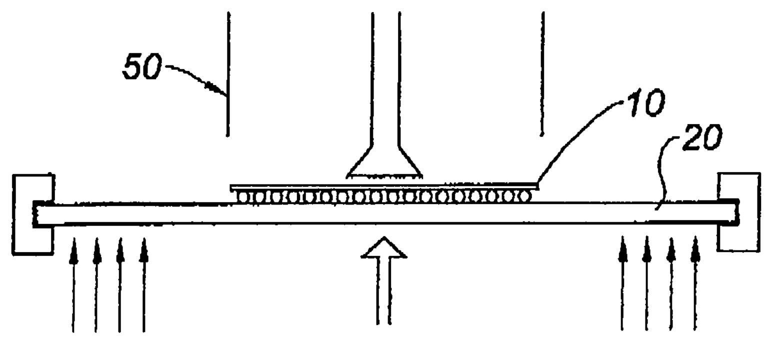

Comparative tests were carried out between an installation according to prior art illustrated in FIG. 3, with heating by hot air applied to the lower face and the installation in FIG. 4.

In the first case, the temperature dispersion is high when a component is being soldered. When activating the solder fluxes (130-150), it is impossible to prevent some areas around and under the component from reaching temperatures close to the liquidus temperature, and remelting of solder on components located in these areas at the peak temperature.

In the second case, the preheating temperature easily reaches the flux activation temperature. However, the temperature dispersion at the different points on the card is significantly reduced when the card is enclosed in a thermal protection chamber.

The invention claimed is:

1. A process for soldering an electronic component onto a support comprising at least one heat drain configured to dissipate heat away from said component when said component is placed on said support, said process comprising the steps of:

before placing said component on said support, preheating the support through the heat drain up to a first temperature, after said support reaches said first temperature, placing the component on the support with a solder paste which incorporates a stripping flux and a solder alloy, wherein said stripping flux is activated at said first temperature and said solder alloy does not melt at said first temperature, heating the component by applying a hot gas at a sufficiently high temperature to bring the solder alloy to a second temperature, wherein said solder alloy melts at said second temperature.

2. A process according to claim 1, wherein said preheating is done by placing a hot plate into contact with the heat drain for the component so as to preheat said support by heat conduction.

3. A process according to claim 2, wherein the hot plate is placed under the support on a side opposite the component.

4. A process according to claim 1, wherein said heating of the component by hot gas includes a preheating step to an intermediate temperature higher than said first temperature and below the second temperature.

5. A process according to claim 1, further comprising placing an electronic card that includes said support in a chamber at least during the preheating step, to homogenize temperatures on the card.

6. A process according to claim 5, wherein said heating step is performed by applying hot gas with a nozzle arranged perpendicular to a plane of the electronic card, and with a gas return duct configured to guide said hot gas after being blown onto the component.

7. A process according to claim 1, further comprising, prior to said preheating, removing a defective component soldered onto said support, wherein said step of removing comprises preheating said support through the heat drain up to said first temperature, and heating the defective component by applying a hot gas at a sufficiently high temperature to bring solder alloy applied to said defective component to the second temperature.

8. A process according to claim 1, wherein said first temperature is 145° C. to 150° C.

9. A process according to claim 8, wherein said second temperature is 230° C. to 240° C.

10. A process according to claim 1, wherein, during said preheating step, said support is not heated by applying heated gas.

11. A process according to claim 1, wherein said component is a Ball Grid Array component.

* * * * *